(12) United States Patent
Ito et al.

(10) Patent No.: US 11,939,699 B2
(45) Date of Patent: Mar. 26, 2024

(54) SIC SUBSTRATE AND SIC INGOT

(71) Applicant: Resonac Corporation, Tokyo (JP)

(72) Inventors: Masato Ito, Ichihara (JP); Hiromasa Suo, Ichihara (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/115,346

(22) Filed: Feb. 28, 2023

(65) Prior Publication Data

US 2023/0392286 A1   Dec. 7, 2023

(30) Foreign Application Priority Data

Jun. 2, 2022  (JP) .................................. 2022-090456

(51) Int. Cl.
*B32B 3/00* (2006.01)
*C01B 32/956* (2017.01)
*C30B 29/36* (2006.01)

(52) U.S. Cl.
CPC ............ *C30B 29/36* (2013.01); *C01B 32/956* (2017.08); *C01P 2006/40* (2013.01)

(58) Field of Classification Search
CPC ......... C30B 23/00; C30B 23/02; C30B 29/36; C01B 32/956
See application file for complete search history.

(56) References Cited

U.S. PATENT DOCUMENTS 8,673,254 B2 * 3/2014 Nakabayashi ........... H01B 1/00
117/108

10,002,760 B2   6/2018 Hansen et al.
2016/0032486 A1 * 2/2016 Hansen .................... C30B 33/10
117/109

FOREIGN PATENT DOCUMENTS

| JP | 2010-254521 A | 11/2010 |
| JP | 4926556 B2 | 5/2012 |
| JP | 2013-100217 A | 5/2013 |
| JP | 2013-147425 A | 8/2013 |
| JP | 5260606 B2 | 8/2013 |

(Continued)

OTHER PUBLICATIONS

Japanese Notice of Reasons for Refusal for JP 2022-090456 dated Jul. 19, 2022.

(Continued)

*Primary Examiner* — Elizabeth E Mulvaney
(74) *Attorney, Agent, or Firm* — Sughrue Mion, PLLC

(57) ABSTRACT

In the SiC substrate, when resistivities at a plurality of first measurement points that are in a region inside a boundary located 5 mm inward from an outer circumferential end thereof and that include a center and a plurality of measurement points separated by 10 mm from each other in the [11-20] direction or the [-1-120] direction from the center, and at two second measurement points that are located 1 mm inward from the outer circumferential end and located in each of the [11-20] direction from the center and the [-1-120] direction from the center are measured, a difference between the maximum resistivity and the minimum resistivity among the resistivities of each of the plurality of first measurement points and the two second measurement points is 2 mΩ·cm or less, and a region other than a high nitrogen concentration region called a facet is included.

20 Claims, 3 Drawing Sheets

(56) References Cited

FOREIGN PATENT DOCUMENTS

JP          5453899 B2      3/2014

OTHER PUBLICATIONS

Hiromasa Suo et al., "Bulk Growth of Low Resistivity n-Type 4H-SiC Using Co-Doping", Journal of Metastable and Nanocrystalline Materials, vol. 897, May 15, 2017, pp. 3-6 (4 pages total), XP093082484, DOI: 10.4028/www.scientific.net/MSF.897.3.

* cited by examiner

SIC SUBSTRATE AND SIC INGOT

BACKGROUND OF THE INVENTION

Field of the Invention

The present invention relates to a SiC substrate and a SiC ingot. Priority is claimed on Japanese Patent Application No. 2022-090456, filed Jun. 2, 2022, the content of which is incorporated herein by reference.

Description of Related Art

Silicon carbide (SiC) has a dielectric breakdown field that is one order of magnitude larger and a bandgap that is three times larger than silicon (Si). In addition, silicon carbide (SiC) has properties such as a thermal conductivity that is about three times greater than silicon (Si). For that reason, silicon carbide (SiC) is expected to be applied to power devices, high-frequency devices, high-temperature operation devices, and the like. For this reason, in recent years, SiC epitaxial wafers have come to be used for such semiconductor devices.

A SiC epitaxial wafer is obtained by laminating a SiC epitaxial layer on a surface of a SiC substrate. Hereinafter, a substrate before a SiC epitaxial layer is laminated thereon is referred to as a SiC substrate, and a substrate after a SiC epitaxial layer has been laminated thereon is referred to as a SiC epitaxial wafer. A SiC substrate is cut out from a SiC ingot.

Patent Documents 1 and 2 describe that, in order to reduce variations in device characteristics, an amount of doping for a SiC substrate is made uniform to improve uniformity in resistivity of the SiC substrate. In Patent Document 1, a SiC single crystal is grown without a facet region being formed, thereby improving uniformity in the amount of doping for the SiC substrate. In Patent Document 2, in contrast, uniformity in the amount of doping for the SiC substrate is improved by faceting the entire measurable region of the substrate. Further, Patent Document 3 describes a method for manufacturing a SiC single crystal ingot having a uniform volume resistivity in a region mm inward from a wafer end.

PATENT DOCUMENTS

[Patent Document 1] Japanese Patent No. 5260606
[Patent Document 2] Japanese Patent No. 5453899
[Patent Document 3] Japanese Patent No. 4926556

SUMMARY OF THE INVENTION

In recent years, a SiC single crystal has been processed with a laser. For example, a SiC single crystal can be split by cracking the SiC single crystal with a laser. For example, laser processing is used at the time of cutting a SiC substrate from a SiC ingot, at the time of further cutting a thinner substrate from the SiC substrate, and at the time of chipping the SiC substrate. Laser processing has the advantage of less cutting loss than processing using a wire saw, but may result in rough cut surfaces or unexpected cracks.

The present invention has been made in view of the above problems, and an object thereof is to provide a SiC substrate and a SiC ingot that are easily processed during laser processing.

The present inventors have found that ease of processing an outer circumferential end of a SiC substrate, which is outside a device acquisition region thereof, greatly contributes to a success rate of processing. Until now, as in Patent Documents 1 to 3, in order to reduce variations in device characteristics, control of a resistivity distribution within a device acquisition region has been performed, but control of a resistivity distribution including a region outside the device acquisition region has not been performed. The region outside the device acquisition region is, for example, a region up to 5 mm, a region up to 3 mm, or the like inward from an outer circumferential end of a SiC substrate.

For example, as described in Patent Documents 1 and 2, during crystal growth by a sublimation method, variations in dopant concentration between an inner region and an outer circumferential region cannot be sufficiently reduced only by controlling positions of facets, and the resistivity distribution outside the device acquisition region cannot be made uniform. This is because growth conditions are not controlled even outside the device acquisition region. Even if the conditions are optimized to make the dopant concentration uniform within the device acquisition region, the growth conditions at an outermost circumferential portion of a growth surface are basically different from those at an inner circumferential portion, and uniformity in a region including a region outside the device acquisition region cannot be achieved unless non-uniformity is imparted to the growth conditions.

In order to solve the above problems, the present invention provides the following means.

(1) A SiC substrate according to a first aspect, wherein, when resistivities at a plurality of first measurement points that are in a region inside a boundary located 5 mm inward from an outer circumferential end thereof and that include a center and a plurality of measurement points separated by 10 mm from each other in the [11-20] direction or the [-1-120] direction from the center, and at two second measurement points that are located 1 mm inward from the outer circumferential end and located in each of the [11-20] direction from the center and the [-1-120] direction from the center are measured, a difference between the maximum resistivity and the minimum resistivity among the resistivities of each of the plurality of first measurement points and the two second measurement points is 2 mΩ·cm or less, and a region other than a high nitrogen concentration region called a facet is included.

(2) In the SiC substrate according to the above aspect, the difference between the maximum resistivity and the minimum resistivity among the resistivities of each of the plurality of first measurement points and the two second measurement points may be 1 mΩ·cm or less.

(3) In the SiC substrate according to the above aspect, the difference between the maximum resistivity and the minimum resistivity among the resistivities of each of the plurality of first measurement points and the two second measurement points may be 0.5 mΩ·cm or less.

(4) In the SiC substrate according to the above aspect, when resistivities at a plurality of third measurement points that are in the region inside the boundary located 5 mm inward from the outer circumferential end and that are separated by 10 mm from each of the plurality of the first measurement points in the [1-100] direction or the [-1100] direction, and at two fourth measurement points that are located 1 mm inward from the outer circumferential end and located in each of the [1-100] direction from the center and the [-1100] direction from the center are further measured, a difference between the maximum resistivity and the minimum resistivity among the resistivities of each of the plurality of first measurement points, the two second measurement points, the plurality of third measurement points, and the two fourth measurement points may be 2 mΩ·cm or less.

(5) In the SiC substrate according to the above aspect, a difference between the maximum resistivity and the minimum resistivity at any two measurement points may be 2 mΩ·cm or less.

(6) In the SiC substrate according to the above aspect, the diameter may be 149 mm or more.

(7) In the SiC substrate according to the above aspect, the diameter may be 199 mm or more.

(8) In the SiC substrate according to the above aspect, the resistivities at the plurality of first measurement points and the two second measurement points may be 20 mΩ·cm or more.

(9) In the SiC substrate according to the above aspect, the resistivities at the plurality of first measurement points and the two second measurement points may be 23 mΩ·cm or more.

(10) In the SiC substrate according to the above aspect, the resistivities at the plurality of first measurement points and the two second measurement points may be 20 mΩcm or less.

(11) In the SiC substrate according to the above aspect, the resistivities at the plurality of first measurement points and the two second measurement points may be 17 mΩ·cm or less.

(12) A SiC substrate according to another aspect, wherein, when resistivities at a plurality of first measurement points that are in a region inside a boundary located 5 mm inward from an outer circumferential end thereof and that include a center and a plurality of measurement points separated by 10 mm from each other in the [11-20] direction or the [−1-120] direction from the center, and at two second measurement points that are located 1 mm inward from the outer circumferential end and located in each of the [11-20] direction from the center and the [−1-120] direction from the center are measured, a difference between the maximum resistivity and the minimum resistivity among the resistivities of each of the plurality of first measurement points and the two second measurement points is 1 mΩ·cm or less, and the diameter is 149 mm or more.

(13) A SiC ingot according to a second aspect, wherein, when a SiC substrate is cut out and resistivities on a cut surface thereof are measured, a difference between the maximum resistivity and the minimum resistivity among resistivities at each of a plurality of first measurement points that are in a region inside a boundary located 5 mm inward from an outer circumferential end and that include a center and a plurality of measurement points separated by 10 mm from each other in the [11-20] direction or the [−1-120] direction from the center, and two second measurement points that are located 1 mm inward from the outer circumferential end and located in each of the [11-20] direction from the center and the [−1-120] direction from the center is 2 mΩ·cm or less, and a region other than a high nitrogen concentration region called a facet is included.

The SiC substrate and the SiC ingot according to the above aspects are easily processed during laser processing.

DETAILED DESCRIPTION OF THE INVENTION

Figure 1:
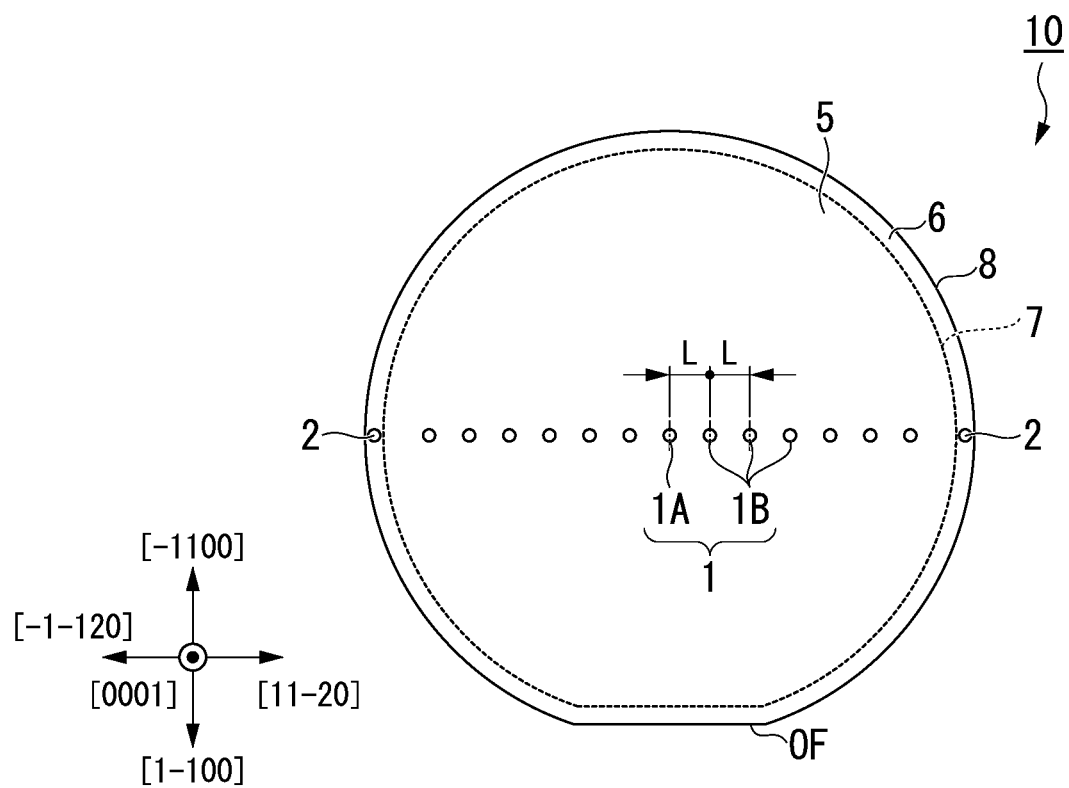
FIG. 1 is a plan view of a SiC substrate according to the present embodiment.

A SiC substrate and the like according to the present embodiment will be described in detail below with reference to the drawings as appropriate. In the drawings used in the following description, there are cases in which featured portions are shown enlarged for the sake of convenience in order to make it easier to understand features of the present embodiment, and dimensional ratios and the like of respective constituent elements may be different from actual ones. Materials, dimensions, and the like provided in the following description are exemplary examples, and the present invention is not limited thereto and can be appropriately modified without changing the gist thereof.

FIG. 1 is a plan view of a SiC substrate 10 according to the present embodiment. The SiC substrate 10 is made of, for example, n-type SiC. A polytype of the SiC substrate 10 is not particularly limited and may be any of 2H, 3C, 4H, and 6H. The SiC substrate 10 is, for example, 4H–SiC.

The shape of the SiC substrate 10 in a plan view is substantially circular. The SiC substrate 10 may have an orientation flat OF or a notch for determining the direction of a crystal axis thereof. The diameter of the SiC substrate 10 is, for example, 149 mm or more, and preferably 199 mm or more. As the diameter of the SiC substrate 10 becomes larger, stable cutting is more difficult achieve in laser processing, and thus the SiC substrate 10 satisfying a configuration of the present embodiment is more useful as it has a larger diameter.

In the SiC substrate 10 according to the present embodiment, a difference between the maximum resistivity and the minimum resistivity among the resistivities of each of a plurality of first measurement points 1 and two second measurement points 2 is 2 mΩ·cm or less.

All of the first measurement points 1 are within a first region 5. The first measurement points 1 include a center 1A and a plurality of measurement points 1B separated by 10 mm from each other in the [11-20] direction or in the [−1-120] direction from the center 1A. A distance L between the center 1A and the adjacent measurement point 1B is 10 mm. A distances L between the measurement points 1B adjacent to each other are also 10 mm. The first region 5 is a region inside a boundary 7 located 5 mm inward from an outer circumferential end 8 of the SiC substrate 10. The first measurement points 1 are not placed on the boundary 7. The first region 5 is located within an effective region for chipping. Chips cut out from the first region 5 can be used for devices.

All of the second measurement points 2 are located within a second region 6. The second measurement points 2 are two points that are located 1 mm inward from the outer circumferential end 8 and located in each of the [11-20] direction from the center 1A and the [−1-120] direction from the center 1A. The second region 6 is a region outside the boundary 7 located 5 mm inward from the outer circumferential end 8. The second region 6 is located outside the effective region for chipping. The second region 6 is in the vicinity of the outer circumferential end 8, in which various parameters are likely to vary. For that reason, chips cut out from the second region 6 are generally not used for devices. The second region 6 is also called an edge exclusion region.

Resistivities can be measured by an eddy current method. The eddy current method is a non-contact resistance measurement method. Resistivities can be measured, for example, with a manual non-contact resistance meter manufactured by Napson Corporation. Diameters of measurement spots of devices using the eddy current method are generally 5 mm or more and 15 mm or less.

In the case of measuring the first measurement points 1, the measurement is performed by disposing the first measurement points 1 at a center of the measurement spot. In the case of measuring the second measurement points 2, the measurement is performed such that the measurement spot does not protrude from the SiC substrate 10.

Figure 2:
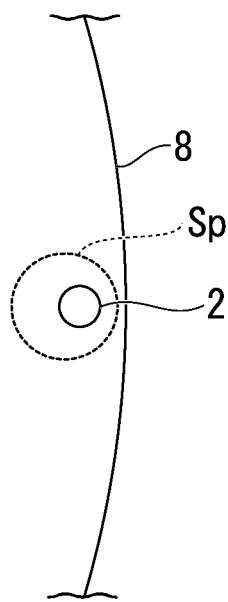
FIG. 2 is a diagram showing a relationship between a second measurement point and a measurement spot.

FIG. 2 is a diagram showing a relationship between a second measurement point 2 and the measurement spot Sp. The second measurement point 2 is located 1 mm inward from the outer circumferential end 8. When the center of the measurement spot Sp is disposed at a center of the second measurement point 2, a portion of the measurement spot Sp having a diameter of 5 mm or more and 15 mm or less is exposed to the outside of the SiC substrate 10. In this case, the accurate measurement cannot be performed. For that reason, the measurement spot Sp is shifted inward so that the portion of the measurement spot Sp does not protrude from the SiC substrate 10 within a range satisfying the condition that the second measurement point 2 is within the measurement spot Sp. The measurement of the resistivity at the second measurement point 2 requires processing such as shifting the measurement spot Sp and is generally not performed.

When the difference between the maximum resistivity and the minimum resistivity among the resistivities of the plurality of first measurement points 1 and the two second measurement points 2 is 2 mΩ·cm or less, it is possible to inhibit a surface roughness of a cut surface cut by laser processing from becoming rough and occurrence of unexpected cracks. Here, cutting of the SiC substrate 10 corresponds to chipping of the SiC substrate 10 and cutting out a thinner substrate from the SiC substrate 10.

Figure 3:
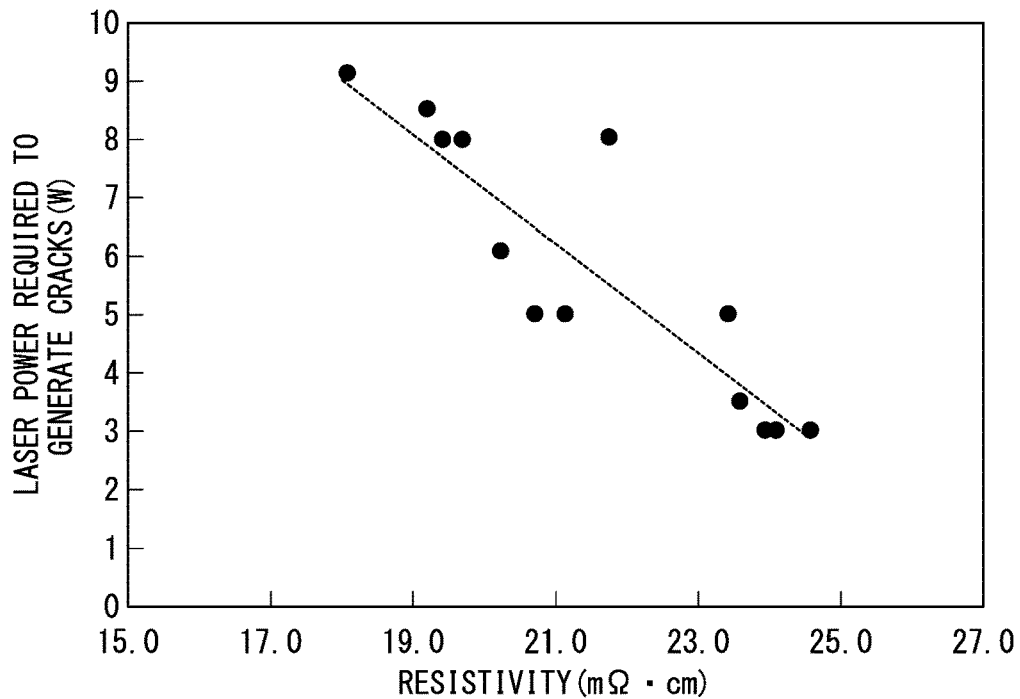
FIG. 3 is a graph showing a relationship between the resistivity of the SiC substrate and the laser power required to generate cracks the SiC substrate.

FIG. 3 is a graph showing a relationship between the resistivity of the SiC substrate 10 and a laser power required to generate cracks the SiC substrate 10. As shown in FIG. 3, as the resistivity of the SiC substrate 10 becomes lower, the laser power required to generate cracks increases. As shown in FIG. 3, when the difference between the maximum resistivity and the minimum resistivity among the resistivities of each of the plurality of first measurement points 1 and the two second measurement points 2 is 2 mΩ·cm or less, uniform cracks can be generated all over the SiC substrate 10 with a constant laser power. Since the laser power does not fluctuate during cutting, it is possible to inhibit the surface roughness of the cut surface from becoming rough and the occurrence of unexpected cracks.

The difference between the maximum resistivity and the minimum resistivity among the resistivities of each of the plurality of first measurement points 1 and the two second measurement points 2 is preferably 1 mΩ·cm or less, and more preferably 0.5 mΩ·cm or less. As the difference between the maximum resistivity and the minimum resistivity becomes smaller, possibility of problems occurring on the cut surface can be reduced, and the success rate of laser processing increases.

In addition, as shown in FIG. 3, as the resistivity of the SiC substrate 10 becomes higher, the laser power required to generate cracks can be decreased. For that reason, the resistivities of the plurality of first measurement points 1 and the two second measurement points 2 are preferably 20 mΩ·cm or more, and more preferably 23 mΩ·cm or more.

Also, from the viewpoint of a device, as the resistivity of the SiC substrate 10 becomes lower, resistance of the device decreases during operation, which leads to a reduction in power consumption. For that reason, the resistivities of the plurality of first measurement points 1 and the two second measurement points 2 are preferably 20 mΩ·cm or less, and more preferably 17 mΩ·cm or less. As described above, in this case, it is required to increase the laser power during cutting, which increases a load from the viewpoint of cutting, but can realize a highly efficient device accordingly.

Figure 4:
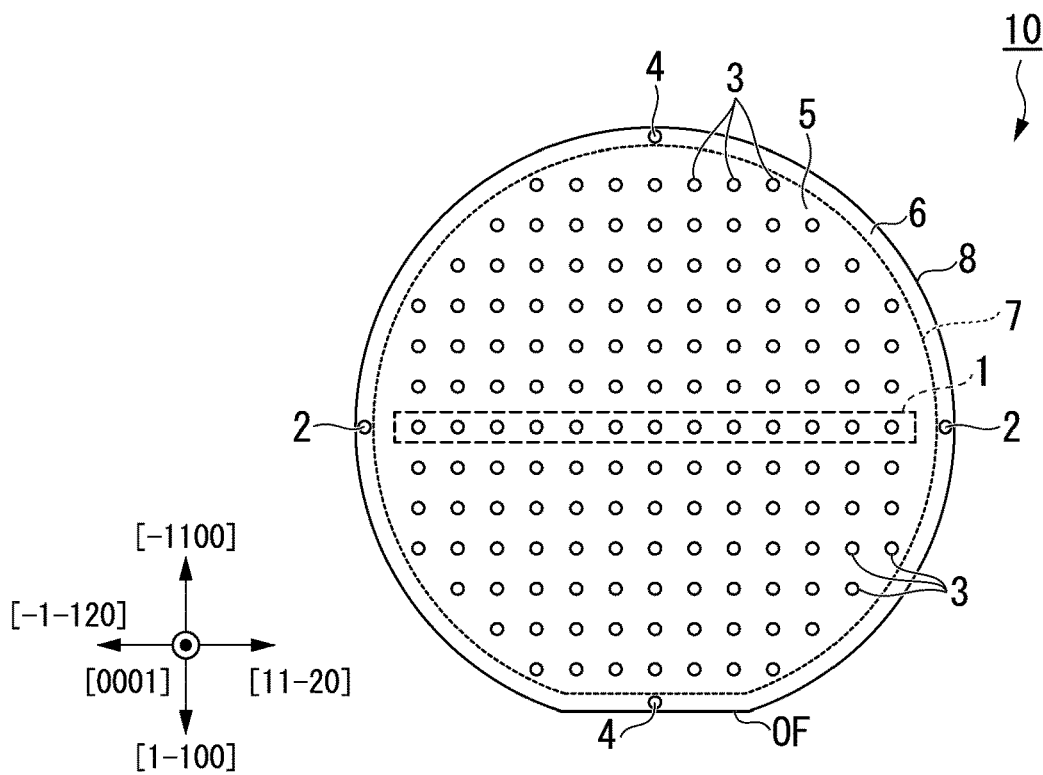
FIG. 4 is a plan view of another example of the SiC substrate according to the present embodiment.

FIG. 4 is a plan view of another example of the SiC substrate 10 according to the present embodiment. In the SiC substrate 10 according to the present embodiment, the difference between the maximum resistivity and the minimum resistivity among resistivities of each of the plurality of first measurement points 1, the two second measurement points 2, a plurality of third measurement points 3, and two fourth measurement points 4 may be 2 mΩ·cm or less. Also, the difference between the maximum resistivity and the minimum resistivity among the resistivities is preferably 1 mΩ·cm or less, and more preferably 0.5 mΩ·cm or less.

All of the third measurement points 3 are within the first region 5. The third measurement points 3 are points separated by 10 mm from each of the plurality of first measurement points 1 in the [1-100] direction or the [−1100] direction. Distances between the first measurement points 1 and the adjacent third measurement points 3 are 10 mm Distances between the third measurement points 3 adjacent to each other are also 10 mm. All of the fourth measurement points 4 are within the second region 6. The fourth measurement points 4 are two points that are located 1 mm inward from the outer circumferential end 8 and located in each of the [1-100] direction from the center 1A and the [−1100] direction from the center 1A.

In the case of measuring the resistivities at the third measurement points 3, the measurement is performed by disposing the third measurement points 3 at the center of the measurement spot. In the case of measuring the resistivities at the fourth measurement points 4, similarly to the measurement at the second measurement points 2, the measurement is performed such that the measurement spot Sp does not protrude from the SiC substrate 10.

Also, in the SiC substrate 10 according to the present embodiment, a difference between the maximum resistivity and the minimum resistivity at any two measurement points is preferably 2 mΩ·cm or less, more preferably 1 mΩ·cm or less, and even more preferably 0.5 mΩ·cm or less.

Next, an example of a method for manufacturing the SiC substrate 10 according to the present embodiment will be described. The SiC substrate 10 is obtained by slicing a SiC ingot. The SiC ingot is obtained, for example, by a sublimation method. The SiC substrate 10 according to the present embodiment can be manufactured by controlling growth conditions of the SiC ingot.

Figure 5:
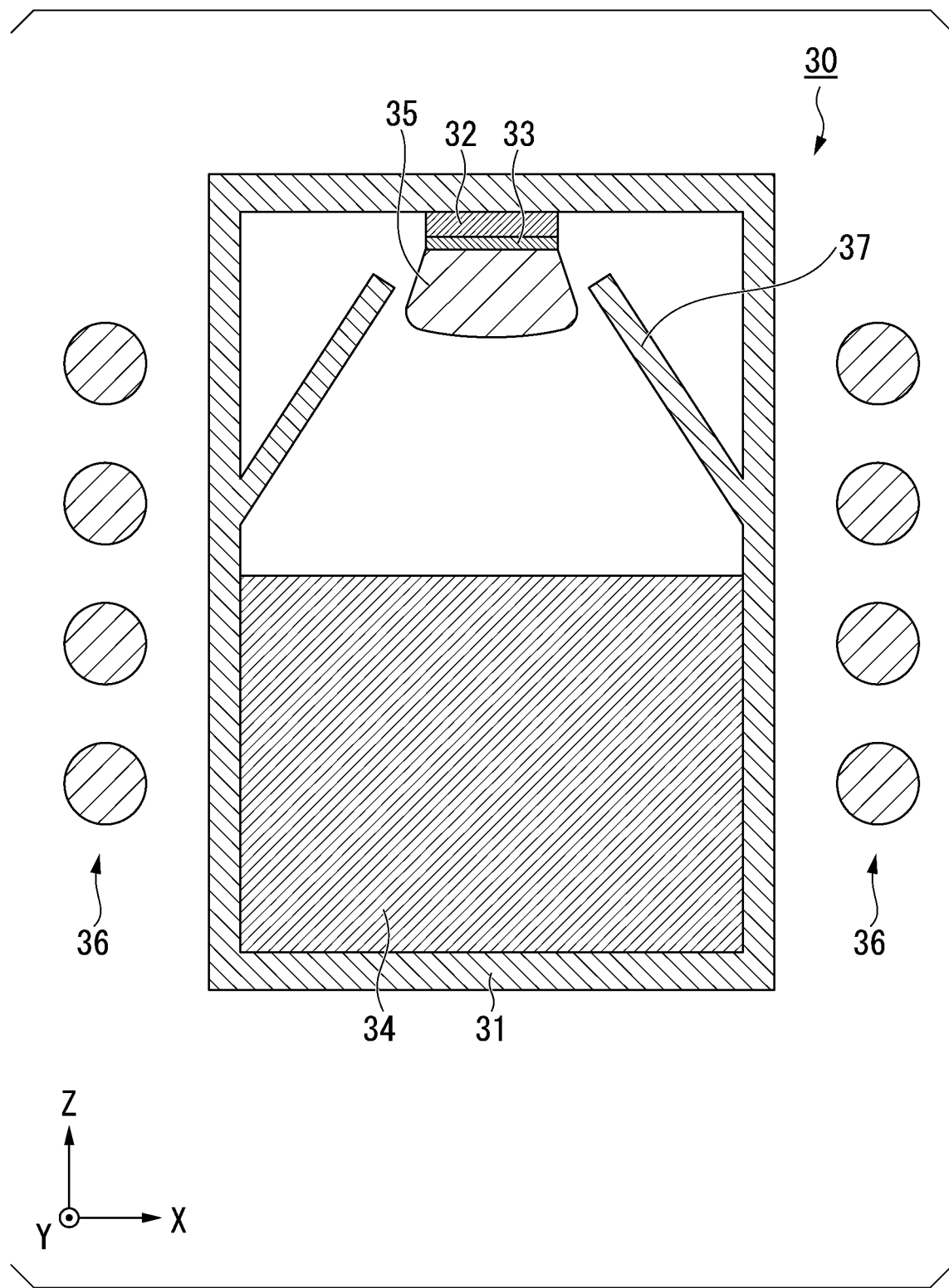
FIG. 5 is a schematic diagram showing a sublimation method, which is an example of a manufacturing device of a SiC ingot.

FIG. 5 is a schematic diagram showing a sublimation method, which is an example of a manufacturing device 30 of the SiC ingot. In FIG. 5, a direction orthogonal to a surface of a pedestal 32 is a z direction, one direction orthogonal to the z direction is an x direction, and a direction orthogonal to the z direction and the x direction is a y direction.

The sublimation method is a method of disposing a seed crystal 33 made of a SiC single crystal on the pedestal 32 disposed in a crucible 31 made of graphite, supplying a sublimation gas sublimated from raw material powder 34 in the crucible 31 to the seed crystal 33 by heating the crucible 31, and growing the seed crystal 33 into a larger SiC ingot 35. The seed crystal 33 is, for example, a SiC single crystal having an offset angle of 4 degrees with respect to the [11-20] direction and is disposed on the pedestal 32 with the C plane as a growth plane. The heating of the crucible 31 is performed by a coil 36, for example. For example, a heat insulating material may be disposed around the crucible 31.

In addition, a tapered member 37 of which the diameter is enlarged from the pedestal 32 toward an inner wall of the crucible 31 may also be disposed inside the crucible 31. By using the tapered member 37, the diameter of the growing single crystal can be increased. By performing crystal growth while enlarging the diameter, a high nitrogen concentration region called a facet can be disposed outside the effective region when the SiC substrate 10 is obtained from SiC ingot 35.

The growth shape of the SiC ingot 35 is likely to be disturbed at its outer circumferential portions in the x and y directions. This is because it is susceptible to disturbance from other members such as the crucible 31. Growth rates and growth surface temperatures are likely to be non-uniform at the outer circumferential portions of the SiC ingot 35 in the x and y directions. Here, states of the outer circumferential portions of the SiC ingot 35 vary depending on growth conditions of the SiC ingot 35. For that reason, the SiC substrate 10 according to the present embodiment can be manufactured by repeating multiple times processing such as production of the SiC ingot 35, cutting of the SiC substrate 10, measurement of the SiC substrate 10, and feedback of the measurement results and changing the growth conditions of the SiC ingot 35. What is measured during the feedback is the resistivity of the SiC substrate 10, and the second measurement points 2, which are 1 mm inward from the outer circumferential end 8, which were hardly measured in known techniques, are always measured.

For example, in the SiC substrate 10 cut out from the SiC ingot 35 produced under certain conditions, in a case in which the resistivities at the second measurement points 2 are higher than the resistivities at the first measurement points 1, the growth conditions are changed on the basis of the results.

For example, the amount of dopants supplied to the outer circumferential portion is made higher than the amount of dopants supplied to its inner circumferential portion. For example, by providing a flow path of a dopant gas in the crucible 31 and adjusting a gas permeability of the crucible 31, the amount of dopants supplied to the outer circumferential portion can be made higher than the amount of dopants supplied to the inner circumferential portion. Further, for example, by providing an opening in the tapered member 37 or adjusting the thickness of the tapered member 37, the amount of dopants supplied to the outer circumferential portion can also be adjusted.

In addition, for example, a C/Si ratio of a sublimation gas supplied to the outer circumferential portion may be lower than a C/Si ratio of the sublimation gas supplied to the inner circumferential portion. A C/Si ratio is an abundance ratio of C gas to Si gas. For example, by changing a heating temperature of the raw material powder 34 between an outer circumference and an inner side thereof, the C/Si ratio of the sublimation gas can be changed depending on locations. For example, when the heating temperature becomes higher, carbons become rich and the C/Si ratio increases.

Further, for example, a temperature of the outer circumferential portion of the crystal growth surface of the SiC ingot 35 may be lower than a temperature of the inner circumferential portion. The temperature of the crystal growth surface can be changed by, for example, installing a heater on the pedestal 32 or installing a heat insulating material.

On the other hand, in the SiC substrate 10 cut out from the SiC ingot 35 produced under certain conditions, in a case in which the resistivities at the second measurement points 2 are lower than the resistivities at the first measurement points 1, the growth conditions are changed in a direction opposite to the above. Specifically, the amount of dopants supplied to the outer circumferential portion is made lower than the amount of dopants supplied to the inner circumferential portion, the C/Si ratio of the sublimation gas supplied to the outer circumferential portion is made higher than the C/Si ratio of the sublimation gas supplied to the inner circumferential portion, and the temperature of the outer circumferential portion of the crystal growth surface of the SiC ingot 35 is made higher than the temperature of the inner circumferential portion.

In this way, the crystal growth conditions of the SiC ingot 35 are determined by repeating the crystal growth of the SiC ingot 35 multiple times and performing feedback of each result. Then, the SiC substrate 10 according to the present embodiment can be manufactured by manufacturing the SiC ingot 35 under the determined growth conditions and cutting the SiC ingot 35.

In the SiC substrate 10 according to the present embodiment, the difference between the maximum resistivity and the minimum resistivity among the resistivities of each of the plurality of first measurement points 1 and the two second measurement points 2 is 2 mΩcm or less. For that reason, the SiC substrate 10 can be laser-processed with a constant laser power. Since the laser power does not fluctuate during cutting, it is possible to inhibit the surface roughness of the cut surface from becoming rough and the occurrence of unexpected cracks.

Although the case in which the SiC substrate 10 is laser-processed has been provided as exemplary examples above, the same applies to a case in which the SiC ingot is laser-processed. For example, the case of cutting the SiC substrate 10 out of the SiC ingot 35 corresponds to the case in which the SiC ingot 35 is laser-processed. The state of SiC ingot 35 is obtained by cutting the SiC substrate 10 from the SiC ingot 35 and evaluating it. The state of SiC ingot 35 is obtained by evaluating the cut surface of the cut-out SiC substrate 10. Where is set to the cut surface depends on a type of a substrate to be acquired, but for example, it is a plane inclined 4° from the (0001) plane with respect to the [11-20] direction. The target thickness of the SiC substrate is, for example, 400 μm.

In the case in which the SiC ingot 35 is laser processed, when the SiC substrate is cut out and the cut surface is evaluated, the difference between the maximum resistivity and the minimum resistivity among the resistivities of each of the plurality of first measurement points 1 and the two second measurement points 2 is preferably 2 mΩ·cm or less. This can be confirmed by measuring the resistivity of the cut surface. When the resistivity of the cut surface is measured, if the difference between the maximum resistivity and the minimum resistivity among the resistivities of each of the plurality of first measurement points and the two second measurement points is 2 mΩ·cm or less, the cut location satisfies the above conditions, and it is possible to inhibit the surface roughness of the cut surface from becoming rough and the occurrence of unexpected cracks during laser processing.

The difference between the maximum resistivity and the minimum resistivity among the resistivities of the plurality of first measurement points 1 and the two second measurement points 2 on the cut surface is more preferably 1 mΩ·cm or less, and more preferably 0.5 mΩ·cm or less.

Also, the difference between the maximum resistivity and the minimum resistivity among the resistivities of each of the plurality of first measurement points 1, the two second measurement points 2, the plurality of third measurement points, and the two fourth measurement points on the cut surface is preferably 2 mΩ·cm or less, more preferably 1 mΩ·cm or less, and even more preferably 0.5 mΩ·cm or less.

In addition, a difference between resistivities at any two points on the cut surface is preferably 2 mΩ·cm or less, more preferably 1 mΩ·cm or less, and even more preferably 0.5 mΩ·cm or less.

Further, the resistivity of the SiC ingot 35 at the cut surface is preferably 20 mΩ·cm or more, and more preferably 23 mΩ·cm or more. Moreover, the resistivity of the SiC ingot 35 at the cut surface may be 20 mΩ·cm or less, or may be 17 mΩ·cm or less.

While preferred embodiments of the invention have been described and illustrated above, it should be understood that these are exemplary examples of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1 First measurement point
1A Center
1B Measurement point
2 Second measurement point
3 Third measurement point
4 Fourth measurement point
5 First region
6 Second region
7 Boundary
8 Outer circumferential end
Sp Measurement spot
30 Manufacturing device
31 Crucible
32 Pedestal
33 Seed crystal
34 Raw material powder
SiC ingot
36 Coil
37 Tapered member

What is claimed is:

1. A SiC substrate,
    wherein, when resistivities at a plurality of first measurement points that are in a region inside a boundary located 5 mm inward from an outer circumferential end thereof and that include a center and a plurality of measurement points separated by 10 mm from each other in the [11-20] direction or the [-1-120] direction from the center, and at two second measurement points that are located 1 mm inward from the outer circumferential end and located in each of the [11-20] direction from the center and the [-1-120] direction from the center are measured, a difference between the maximum resistivity and the minimum resistivity among the resistivities of each of the plurality of first measurement points and the two second measurement points is 2 mΩ·cm or less, and
    a region other than a high nitrogen concentration region called a facet is included.

2. The SiC substrate according to claim 1, wherein the difference between the maximum resistivity and the minimum resistivity among the resistivities of each of the plurality of first measurement points and the two second measurement points is 1 mΩ·cm or less.

3. The SiC substrate according to claim 2,
    wherein the difference between the maximum resistivity and the minimum resistivity among the resistivities of each of the plurality of first measurement points and the two second measurement points is 0.5 mΩ·cm or less.

4. The SiC substrate according to claim 1,
    wherein, when resistivities at a plurality of third measurement points that are in the region inside the boundary located 5 mm inward from the outer circumferential end and that are separated by 10 mm from each of the plurality of the first measurement points in the [1-100] direction or the [-1100] direction, and at two fourth measurement points that are located 1 mm inward from the outer circumferential end and located in each of the [1-100] direction from the center and the [-1100] direction from the center are further measured, a difference between the maximum resistivity and the minimum resistivity among the resistivities of each of the plurality of first measurement points, the two second measurement points, the plurality of third measurement points, and the two fourth measurement points is 2 Ω·cm or less.

5. The SiC substrate according to claim 1,
    wherein a difference between the maximum resistivity and the minimum resistivity at any two measurement points is 2 m Ω·cm or less.

6. The SiC substrate according to claim 1,
    wherein the diameter is 149 mm or more.

7. The SiC substrate according to claim 6,
    wherein the diameter is 199 mm or more.

8. The SiC substrate according to claim 1,
    wherein the resistivities at the plurality of first measurement points and the two second measurement points are 20 mΩ·cm or more.

9. The SiC substrate according to claim 8,
    wherein the resistivities at the plurality of first measurement points and the two second measurement points are 23 mΩ·cm or more.

10. The SiC substrate according to claim 1,
    wherein the resistivities at the plurality of first measurement points and the two second measurement points are 20 mΩ·cm or less.

11. The SiC substrate according to claim 10,
    wherein the resistivities at the plurality of first measurement points and the two second measurement points are 17 mΩ·cm or less.

12. A SiC substrate,
    wherein, when resistivities at a plurality of first measurement points that are in a region inside a boundary located 5 mm inward from an outer circumferential end thereof and that include a center and a plurality of measurement points separated by 10 mm from each other in the [11-20] direction or the [−1-120] direction from the center, and at two second measurement points that are located 1 mm inward from the outer circumferential end and located in each of the [11-20] direction from the center and the [−1-120] direction from the center are measured, a difference between the maximum resistivity and the minimum resistivity among the resistivities of each of the plurality of first measurement points and the two second measurement points is 1 mΩ·cm or less, and the diameter is 149 mm or more.

13. A SiC ingot, wherein, when a SiC substrate is cut out and resistivities on a cut surface thereof are measured, a difference between the maximum resistivity and the minimum resistivity among resistivities at each of a plurality of first measurement points that are in a region inside a boundary located 5 mm inward from an outer circumferential end and that include a center and a plurality of measurement points separated by 10 mm from each other in the [11-20] direction or the [−1-120] direction from the center, and two second measurement points that are located 1 mm inward from the outer circumferential end and located in each of the [11-20] direction from the center and the [−1-120] direction from the center is 2 mΩ·cm or less, and a region other than a high nitrogen concentration region called a facet is included.

14. The SiC substrate according to claim 12,
wherein the SiC substrate has a region other than a high nitrogen concentration region called a facet.

15. The SiC substrate according to claim 14,
wherein at least one of the plurality of first measurement points belong to the region other than the facet.

16. The SiC substrate according to claim 14,
wherein one of the two second measurement points belong to the region other than the facet.

17. The SiC substrate according to claim 14,
wherein at least one of the center, one of the plurality of first measurement points, and one of the two second measurement points belong to the region other than the facet.

18. The SiC substrate according to claim 12,
wherein the SiC substrate has a facet of high nitrogen concentration and a region other than the facet.

19. The SiC substrate according to claim 18,
wherein at least one of the plurality of first measurement points belong to the region other than the facet.

20. The SiC substrate according to claim 13,
wherein an offset angle of the SiC ingot with respect to the [11-20] is 4 degrees or more.

* * * * *